(12) United States Patent
Kipka et al.

(10) Patent No.: US 6,776,706 B2
(45) Date of Patent: Aug. 17, 2004

(54) MODULAR FAN SYSTEM FOR AN ENCLOSURE

(75) Inventors: Shawn J. Kipka, St. Francis, MN (US); Bryon K. Jorgenson, Lino Lakes, MN (US); Joe Ricke, Arden Hills, MN (US); Seweryn Sadura, Plymouth, MN (US); Anthony K. Gross, Chanhassen, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 09/832,483

(22) Filed: Apr. 11, 2001

(65) Prior Publication Data

US 2002/0173265 A1 Nov. 21, 2002

(51) Int. Cl.[7] .................................................. H05K 7/20
(52) U.S. Cl. ..................... 454/184; 55/385.4; 55/385.7; 55/467; 361/695
(58) Field of Search .............................. 55/385.4, 385.7, 55/467; 454/184; 361/695

(56) References Cited

U.S. PATENT DOCUMENTS

| | | | | |
|---|---|---|---|---|
| 5,586,865 A | * | 12/1996 | Yin ............................ | 165/80.3 |
| 5,788,566 A | * | 8/1998 | McAnally et al. .......... | 361/695 |
| 6,071,082 A | | 6/2000 | Lecinski et al. ............. | 417/53 |
| 6,110,245 A | * | 8/2000 | Schlag et al. ............... | 454/184 |
| 6,190,135 B1 | | 2/2001 | Winkler ...................... | 416/247 |
| 6,215,659 B1 | | 4/2001 | Chen ........................... | 361/695 |
| 6,302,781 B1 | | 10/2001 | Ayres et al. ................. | 454/184 |
| 6,304,443 B1 | * | 10/2001 | Chou ........................... | 361/695 |

* cited by examiner

Primary Examiner—Harold Joyce
(74) Attorney, Agent, or Firm—Schwegman, Lundberg, Woessner & Kluth, P.A.

(57) ABSTRACT

In one aspect, a modular fan system includes a fan, a plenum member adapted to be mounted to the fan and adapted to be mounted to an enclosure, a gasket adapted to be mounted between the plenum member and the enclosure, a filter adapted to be mounted within the plenum member, and a grille adapted to be mounted to the plenum member. In the system, one or more of the fan, the plenum member, the gasket, the filter, and the grille are both assemblable into a first fan assembly and are alternatively assemblable into a second fan assembly. Another aspect also provides a stand-off collar adapted to be mounted to the enclosure, a first grille adapted to be mounted to the plenum member and adapted to be alternatively mounted to the stand-off collar, and an EMI/RFI shielding grille adapted to be mounted to the plenum member. In this system, one or more of the fan, the plenum member, the stand-off collar, the first grille, and the shielding grille are assemblable into both a non-EMI/RFI-shielding fan assembly and are alternatively assemblable into a EMI/RFI-shielding fan assembly.

11 Claims, 8 Drawing Sheets

MODULAR FAN SYSTEM FOR AN ENCLOSURE

FIELD OF THE INVENTION

This invention generally relates to the field of enclosures, and more specifically to a fan system for an enclosure.

BACKGROUND

Electrical enclosures are cabinet structures for holding electronic equipment such as computer systems. As electronic systems become more dense, they generate a large amount of heat. In the past, enclosures were cooled by providing perforated cut-outs on the enclosure to allow airflow to cool the electronics within the enclosure. Sometimes fans are mounted against the perforations to force cool air into the enclosure. Typically, a second perforated cut-out is provided on the enclosure as an exhaust vent. Thus, the fan forces air into the enclosure through the first perforated cut-out, the air conducts heat away from electrical components, and then the warmed air is blown out through the second perforated cut-out.

Sometimes, the enclosure must be sealed to protect the electronic components inside from being contaminated by dust, dirt, water, mist, and other contaminants. Typically, cooling a sealed enclosure requires the use of a heat exchanger or air conditioner. These solutions are more costly compared to using cut-outs and fans.

Sometimes, the enclosure requires protection from EMI/RFI radiation. This is achieved by making the perforated cut-outs small enough to block the level of radiation. Another method uses a metal screen or a conductive filter to block the radiation.

Although these designs may work well for custom designed enclosures, where the designer can anticipate the cooling, filtration, level and/or radiation level expected, modifying the system after the enclosure has been constructed is costly and undesirable. Also, sometimes an electronic system is upgraded, and the enclosure is then unusable since it is designed for the original system. Moreover, each user of a system has different opinions on the aesthetics of the design.

Thus, what is needed is a system that permits a customer to easily change the filtration, and/or radiation, and/or aesthetic features of a mass produced enclosure without the expense of a custom designed enclosure.

SUMMARY

Accordingly, a modular fan system has been devised that provides a user with upgradable flexibility and allows an original system to have a wide variety of set-ups depending on the user's requirements. In one aspect, a modular fan system includes a fan, a plenum member adapted to be mounted to the fan and adapted to be mounted to an enclosure, a gasket adapted to be mounted between the plenum member and the enclosure, a filter adapted to be mounted within the plenum member, and a grille adapted to be mounted to the plenum member. In the system, the fan, the plenum member, and one or more of the gasket, the filter, and the grille are assemblable into a first fan assembly and into a second fan assembly.

One aspect provides a modular fan system which includes a fan, a plenum member adapted to be mounted to the fan and adapted to be mounted to an enclosure, a stand-off collar adapted to be mounted to the enclosure, a first grille adapted to be mounted to the plenum member and adapted to be alternatively mounted to the stand-off collar, and an EMI/RFI shielding grille adapted to be mounted to the plenum member. In the system, the fan, the plenum member, and one or more of the stand-off collar, the first grille, and the shielding grille are assemblable into both a non-EMI/RFI-shielding fan assembly and are alternatively assemblable into a EMI/RFI-shielding fan assembly.

The present invention provides a system which gives a buyer/user the options of various levels of filtration, field installable upgrades for EMI/RFI protection, and/or optional grille aesthetics. This allows a customer to change the cooling and/or radiation features of a mass produced enclosure without the expense of a custom designed enclosure.

DETAILED DESCRIPTION

In the following detailed description, reference is made to the accompanying drawings that form a part hereof, and in which are shown by way of illustration specific embodiments in which the invention may be practiced. It is understood that other embodiments may be utilized and structural changes may be made without departing from the scope of the present invention.

The enclosures, fan systems, and so on described herein can be oriented in virtually any direction. Thus, as used herein, the terms "horizontal," "vertical," "upward," and "lateral, etc. identify only relative directions with respect to the figures, regardless of absolute orientation. Also, as used herein, filter and enclosure types and ratings (i.e., type 1, type 12, etc.) will refer to the NEMA (National Electrical Manufacturers Association) standards as set forth in NEMA Standards Publication 250-1997, "*Enclosures for Electrical Equipment (1000 Volts Maximum)*."

Overview of System

Figure 1:
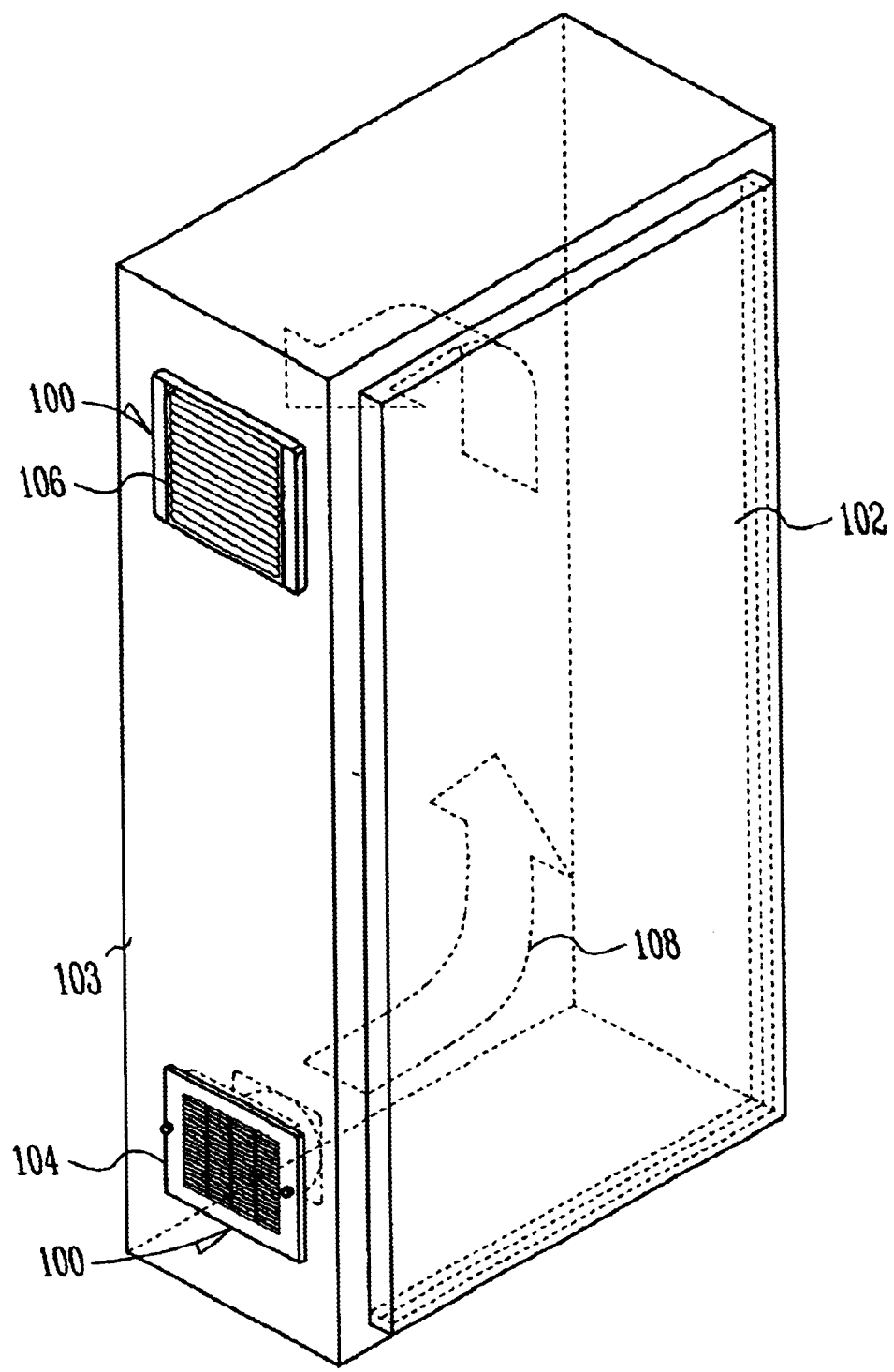
FIG. 1 shows an isometric view of a modular fan package system according to one embodiment of the present invention.

FIG. 1 shows a modular fan system 100 according to one embodiment of the present invention. Modular fan system 100 provides an airflow through an enclosure 102. Enclosure 102 is a conventional enclosure which can be used to hold various electronic components or other heat-producing devices. Enclosure 102 includes panels 103 which include one or more holes or openings for airflow as will be discussed below.

Modular fan system 100 includes a fan assembly 104 and an exhaust assembly 106 which are mounted to panel 103 of enclosure 102. As shown in FIG. 1, air-flow 108 flows through enclosure 102 via fan assembly 104 and is exhausted by exhaust assembly 106. In some embodiments, a fan of fan assembly 104 can be reversed and air comes into enclosure 102 through exhaust assembly 106 and is drawn out through fan assembly 104. Thus, depending on the context, exhaust as used herein means either intake or outflow of air.

In some embodiments, exhaust assembly 106 is omitted and an additional fan assembly 104 is added to improve the airflow. Fan assembly 104 and exhaust assembly 106 can be located on virtually any surface of enclosure 102. The configuration shown is merely exemplary.

Fan assembly 104 and exhaust assembly 106 of the present system are modular assemblies. This means that one or more components or members of each fan assembly 104 and/or exhaust assembly 106 have pre-determined, standardized dimensions and are configured to provide for easy assembly, disassembly, repair, and/or a flexible arrangement or rearrangement of parts. This allows flexibility and variety in original design, as well as provides for easy upgradability and downgradability.

This modularity provides that modular system 100 provides a low-cost cooling solution giving a buyer/user the options of various types of filter protection, field installable upgrades for EMI/RFI protection, and/or optional grille aesthetics. This allows a customer to change the cooling and/or radiation features of a mass produced enclosure, such as enclosure 102, without the expense of a custom designed enclosure.

Figure 2A:
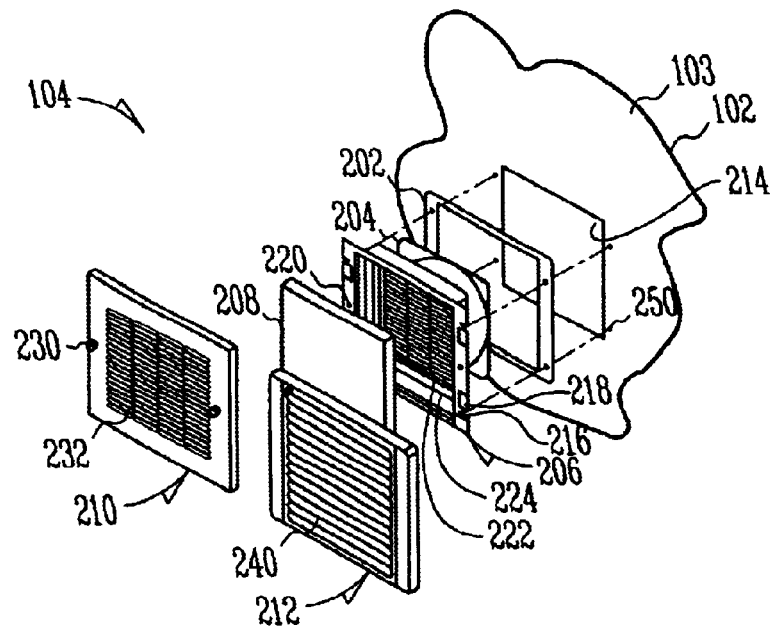
FIG. 2A is an exploded view of portions of a modular fan system according to one embodiment.

FIG. 2A is an exploded isometric view showing one or more features of fan assembly 104 according to one embodiment. Modular fan assembly 104 includes a sealing member such as a gasket 202, a fan 204, a plenum member 206, a filter 208, and alternatively mountable first and second grilles, such as a plastic grille 212 and a metal grille 210. These members are mountable on panel 103 of enclosure 102 to provide airflow through a hole 214 in panel 103.

Sealing gasket 202 provides a seal to prevent contaminants from getting into enclosure 102. In this embodiment, sealing gasket 202 is positioned between plenum member 206 and panel 103. In one embodiment, sealing gasket 202 is attached by an adhesive to plenum member 206 around its perimeter. Sealing gasket 202 includes an inner hole which allows air-flow therethrough.

Sealing gasket 202 is an optional member of modular fan assembly 104. For instance, if a low level of filtering is required (for example, as in a NEMA type 1 enclosure), assembly 104 needn't include sealing gasket 202. On the other hand, if a user needed to change from a low level of filtering to a higher level (for example to a NEMA type 12 enclosure), sealing gasket 202 is readily mountable in the system along with filter 208. In one embodiment, sealing gasket 202 and filter 208 provide NEMA type 12 filtering for the enclosure. As will be apparent to those skilled in the art, other NEMA enclosure types are also possible using the present system. For instance, depending on other design parameters, the present system can be incorporated into enclosures having NEMA ratings from 1–13. Moreover, the shape and structure of the other members of fan assembly 104, such as plenum member 206 allow a minimal amount of gasket to be used in the present system. Accordingly, this provides a more compact structure than conventional fan assemblies.

Fan 204 draws or forces air or other cooling fluid through hole 214. In one embodiment, fan 204 is a conventional rectangular 4" fan. Other fans are usable within the present system, such as 5", 6", 10", for example. In one embodiment, a finger guard is mounted to the back side of fan 204.

Plenum member 206 is mounted to fan 204 and includes one or more panel mounting holes or notches 216 for being mounted to corresponding holes 250 in panel 103. Plenum member 206 is mountable on either the outside or the inside surface of panel 103. Plenum member 206 also includes one or more first attachment members 218, one or more second attachment members, such as mounting holes 220, a back surface 222, and a plenum area 224.

Attachment members 218 and 220 are designed to provide for the optional mounting of a variety of grilles to plenum member 206, and provide for ease of adjustability if a user decides to change the type of grille being used. For instance, in one option attachment members 218 allow a snap-on grille, such as grille 212, which has corresponding mounting members, to be mounted to plenum member 206. In another option, attachment members 218 also permit attachment of EMI/RFI shielding grilles, as will be discussed below.

Attachment holes 220 allow for the optional mounting of a grille having different mounting members, such as mounting members 230 of metal grille 210, to plenum member 206. In one embodiment, holes 220 include a counter-bore or cut-out portion which permits the mounting of retaining bolts or retaining washers therein. This design permits a user to easily change between plastic grilles and metal grilles as the need arises. In one option, to be described below, plastic grille 212 is also mountable to the plenum member using attachment holes 220.

Thus, among other advantages, plenum member 206 includes features for mounting a snap-on plastic grille or using threaded studs and retaining washers for installing a metal grille.

In one embodiment, back surface 222 of plenum member 206 includes a plurality of perforations.

In one embodiment, plenum area 224 includes an open area between back surface 222 and the front of plenum member 206. In one embodiment, plenum area 220 has a depth of approximately ¼ inch. Other embodiment have depths of ½ inch, ¾ inch, 1 inch, or higher than 1 inch. As will be discussed below, in various embodiments fan system 100 includes a filter mounted in the plenum area. Other embodiments omit a filter.

One example of a filter 208 is shown in FIG. 2A. In one embodiment, the filter provides an enclosure having NEMA type 1 filtration. Filter 208 is optional within fan package system 100 and is easily removable and/or replaceable. One option includes mounting a filter providing NEMA type 12 filtration in the system. Other levels of filtration are also within the scope of the present system. Accordingly, aspects of the present invention can be incorporated into enclosures designed to protect against various environmental conditions and applications as defined by NEMA or UL, for example.

As noted above, in one option, modular fan assembly 104 includes a metal grille such as steel grille 210. In one embodiment, metal grille 210 includes one or more mounting members, such as thumb-nuts 230, and also includes a plurality of perforations 232. In this embodiment, thumb-nuts 230 correspond to and mate with threaded studs or bolts which would be mounted within holes 220 of plenum member 206. Some embodiments include wing-nuts or other mounting members for grille 210. In some embodiments, the nut member is mounted or integral with plenum member 206, and grille 210 includes a threaded stud or bolt for attaching the grille to the plenum member.

In an alternative option, modular fan assembly 104 includes grille 212. In one embodiment, grille 212 is a plastic grille and includes one or more perforations 240. In one embodiment, grille 212 includes snap-on mounting features for mounting the grille to plenum member 206. These mounting features and other features of grille 212 will be discussed below.

Modular fan assembly 104 can be mounted in various ways on panel 103. For instance, one option includes mounting plenum member 206 directly to panel 103 without sealing gasket 202 therebetween and mounting a first grille such as plastic grille 212 to plenum member 206 without filter 208 mounted therein. Another option mounts sealing gasket 202 between plenum member 206 and panel 103, and mounts a filter 208 within plenum member 206 and uses a second grille such as metal grille 210. Other options are easily achievable.

Figure 2B:
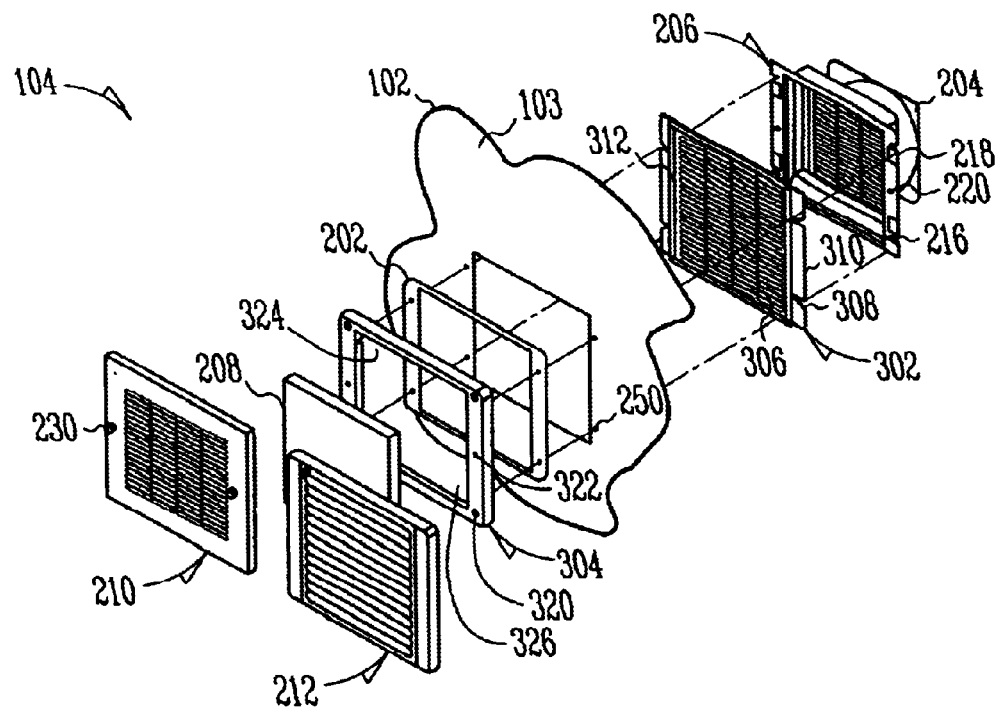
FIG. 2B is an exploded view of portions of a modular fan system according to one embodiment.

FIG. 2B shows another set of options for modular fan assembly 104. In this option, fan assembly 104 includes sealing gasket 202, fan 204, plenum member 206, filter 208, and first or second grille options 210 or 212, which were described above. Assembly 104 also includes EMI/RFI shielding grille 302 and EMI/RFI standoff collar 304.

EMI/RFI shielding grille 302 is a metal grille which contains a plurality of perforations 306, one or more mounting holes or notches 308, and a sealing strip 312 around a perimeter of the grille. In one embodiment, perforations 306 are dimensioned to block EMI/RFI radiation.

In assembly 104, mounting holes 308 are positioned on the perimeter area of grille 302 to match mounting holes 216 of plenum member 206 and mounting holes 250 of panel 103. In one embodiment, shielding grille 302 is dimensioned so that its outer edges 310 frictionally fit within attachment members 218 of plenum member 206. Both of these features help mount grille 302 to plenum member 206.

Stand-off collar 304 is a EMI/RFI standoff collar. In one embodiment, standoff collar 304 includes grille attachment members such as first grille mounting holes 320 and second grille mounting holes 322. Collar 304 also includes bolt holding sections 324, and an inner opening 326, which is dimensioned to provide a mounting position for optional filter 208.

Grille mounting holes 320 are for mating with a mounting stud or similar device coupled with grille 212 as will be discussed below.

Metal grille mounting holes 322 are positioned on collar 304 in an analogous position as holes 220 of plenum member 206. Like holes 220, mounting holes 322 provide a counter-bore or cut-out portion for allowing a threaded stud or bolt to be mounted therein for attaching thumb-nuts 230 of metal grille 210 to the collar. In one option, grille 212 can be modified to mount to mounting holes 322, as will be discussed below.

Thus, stand-off collar 304 permits a user to optionally mount either grille 210 or grille 212 thereto. In one option, standoff collar 304 is used as part of an upgradable EMI/RFI upgrade package. As noted above, among other advantages, standoff collar 304 provides a space on the exterior side of the enclosure wall for the filter. Standoff collar 304 also includes features for alternatively mounting either a composite plastic snap-on grille or a metal grill.

Moreover, modular fan assembly 104 provides that either grille 210 or 212 is mountable to either stand-off collar 304 or plenum member 206 as need be. This modular design provides ease of design and ease of adjustability.

Figure 2C:
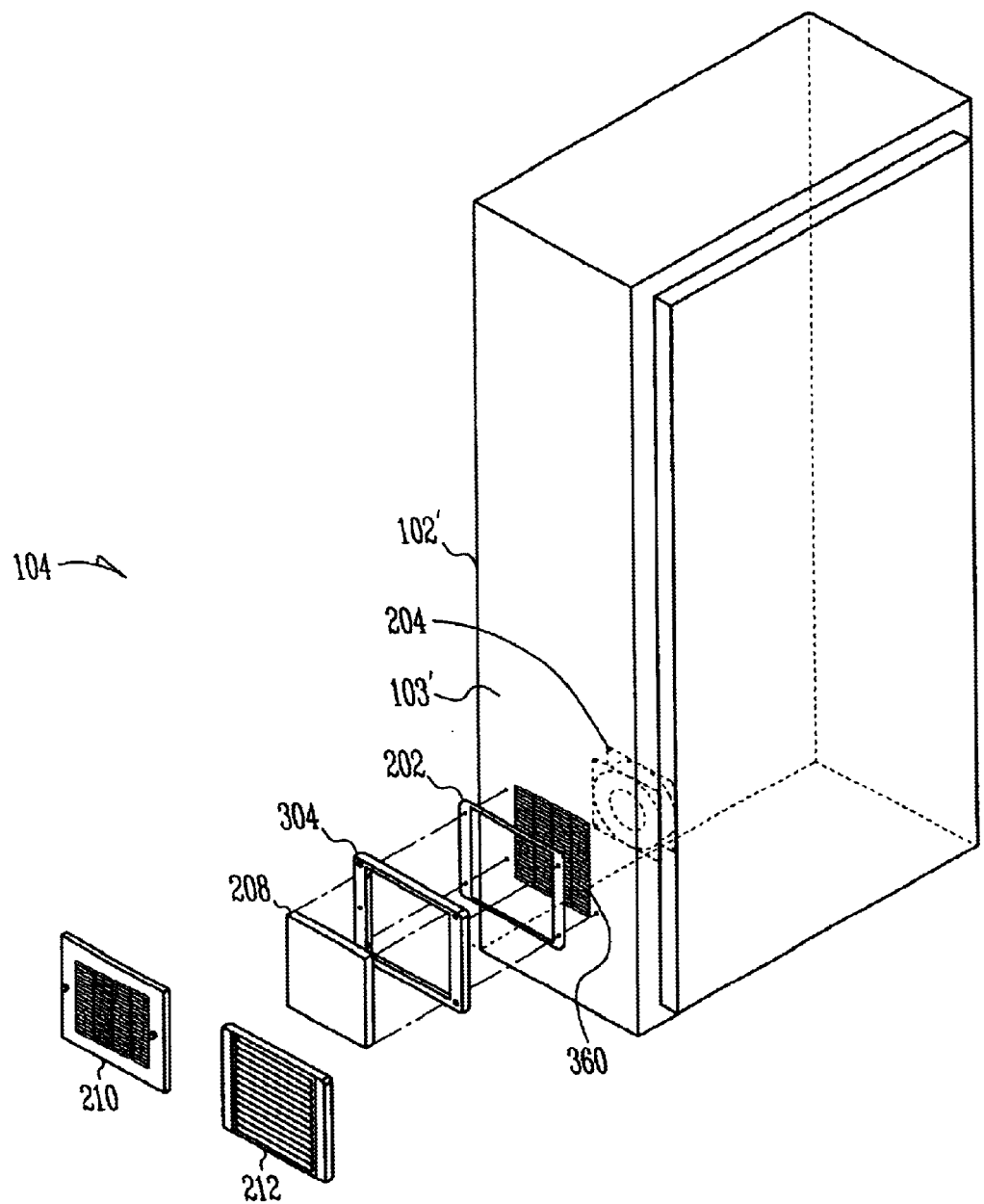
FIG. 2C is an exploded view of portions of a modular fan system according to one embodiment.

FIG. 2C shows fan assembly 104 according to another assembly option. Fan assembly 104 in FIG. 2C includes similar features to those shown in FIG. 2B, including a fan 204, a stand-off collar 304, a filter 208, and alternative first and second grilles 210 and 212. However, this option omits EMI/RF grille 302. In this embodiment, a panel 103' of an enclosure 102' includes a plurality of perforations 360 punched or cut into the panel. Perforations 360 are configured into an EMI/RF grille pattern, so that this option provides EMI/RF filtering.

Figure 3A:
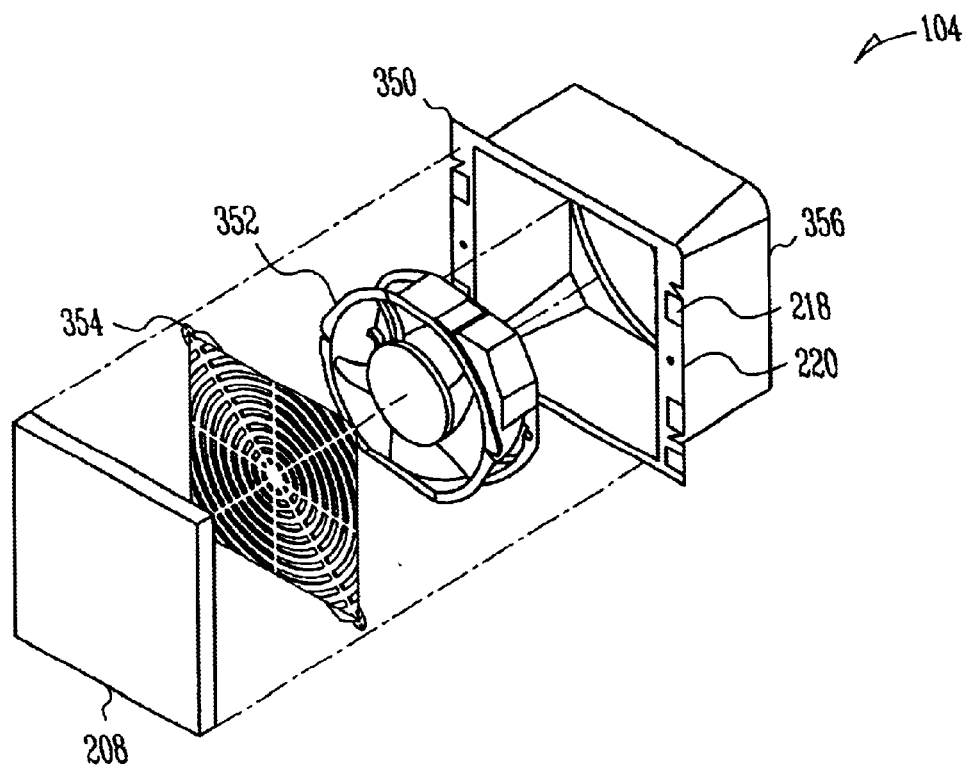
FIG. 3A is an exploded isometric view of a fan assembly according to one embodiment.
Figure 3B:
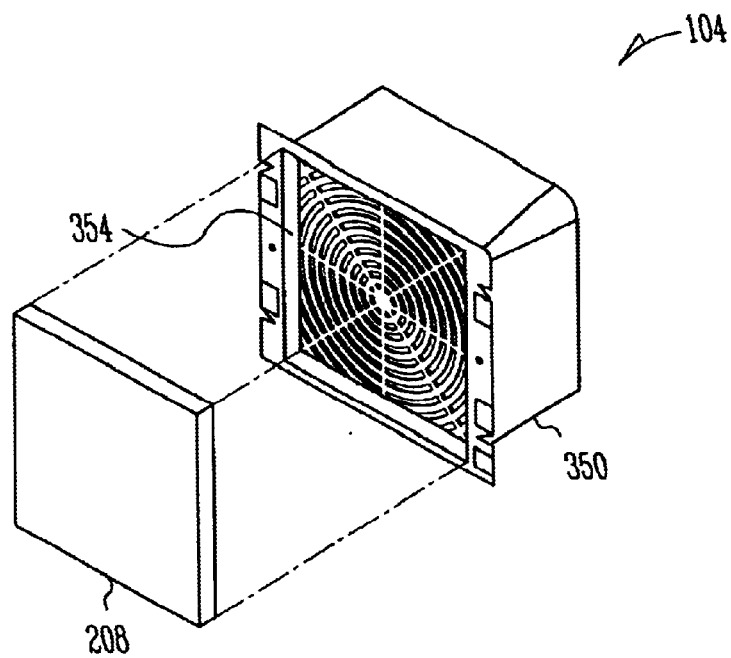
FIG. 3B is an isometric view of the fan assembly of FIG. 3A.

FIGS. 3A and 3B show a plenum member 350 according to another option of fan assembly 104. In this embodiment, plenum member 350 is a box-style plenum and includes a back surface 356 which includes a plurality of perforations. Plenum member 350 also includes attachment members 218 and 220 which correspond to the attachment features of plenum member 206 described above.

In this embodiment, a fan 352 is mountable to an inner, back surface 356 of plenum member 350. A finger guard 354 is mountable within the open front area of the plenum member. A filter, such as filter 208, is mountable within the space between finger guard 354 and the open front of the plenum member. A grille (not shown), such as grilles 210 or 212, is mountable to the plenum member 350 attachment members 218 or 220 as described above for plenum 206. In one embodiment, fan 352 includes a 6" fan. Another option mounts a 10" fan to the plenum member.

Referring to FIGS. 2A, 2B, 2C, 3A, and 3B, it can be seen that modular fan assembly 104 provides for a large number of adjustable, upgradable, and original modular designs. In various options, almost any member or section of fan assembly 104 described above can be omitted or moved to a different position within the assembled fan system.

Figure 4A:
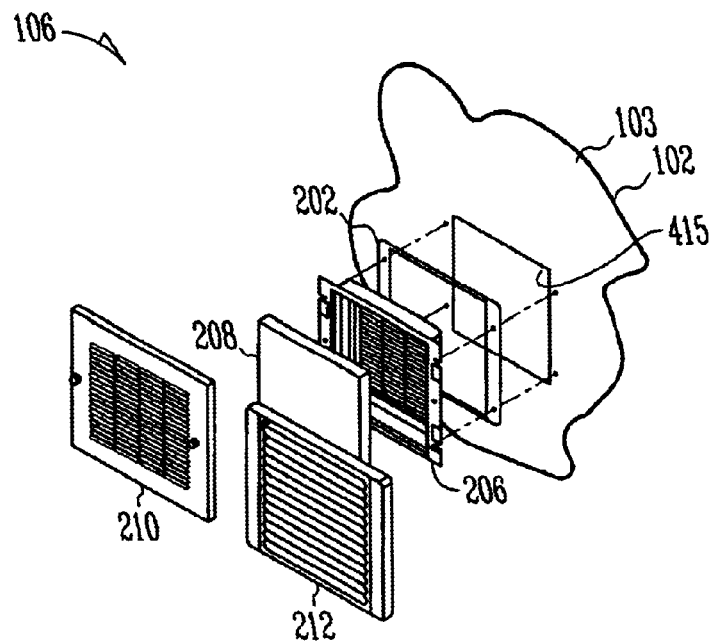
FIG. 4A is an exploded view of portions of a modular exhaust system according to one embodiment.

FIG. 4A shows an example of various options for exhaust assembly 106. Advantageously, one or more of the modular components of fan assembly 104 described above can also be assembled to create exhaust assembly 106 depending on the needs of the designer or user.

For instance, FIG. 4A shows sealing gasket 202, plenum member 206, filter 208, and grille options metal grille 210 and plastic grille 212. These members are mountable on panel 103 of enclosure 102 to provide exhaust through a hole 415 in panel 103.

As discussed above regarding fan assembly 104, the various members of exhaust assembly 106 can be omitted or positioned in various orders.

For instance, in one option sealing gasket 202 is omitted, plenum 206 is mounted directly to panel 103, filter 208 is omitted, and plastic grille 212 is mounted to plenum member 206.

Figure 4B:
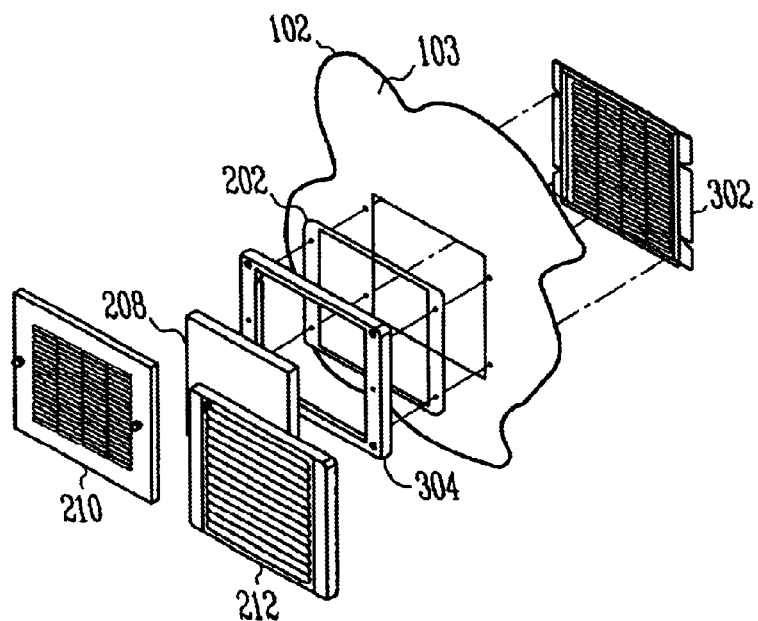
FIG. 4B is an exploded view of portions of a modular exhaust system according to one embodiment.

FIG. 4B shows an example of modular exhaust assembly 106 when set up for EMI/RFI shielding. In this example, EMI/RFI shielding grille is mounted to an inside of panel 103. Sealing gasket 202 is mounted to an outer wall of panel 103, standoff collar 304, filter 208, and grilles 210, or 212 can be used.

Figure 5:
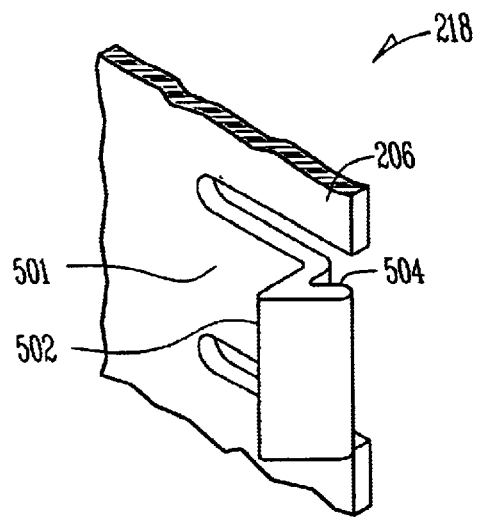
FIG. 5 is a isometric view of an attachment member in accord with one embodiment.

FIG. 5 shows further details of attachment member 218 of plenum member 206 according to one embodiment. Attachment member 218 includes a clip structure which has a main body 501 having a hook-shape at one end. In this embodiment, the hook-shaped portion includes a back connection surface 504 and an inner mounting surface 502.

Inner mounting surface 502 provides frictional or compressive mounting for a member such as EMI/RFI shielding grille 302 described above in FIG. 3. Specifically, in one embodiment, the outer edges 310 of grille 302 press against each of inner mounting surfaces 502 of each of the one or more attaching members 218 of plenum member 206. As noted above, grille 302 is further assembled within fan assembly 104 through mounting holes 302. However, by utilizing inner mounting surface 504, the task of mounting EMI/RFI grille 308 is made easier.

Back connection surface 504 provides an extension member for mounting a grille such as plastic grille 212 to plenum member 206. As will be described below, plenum member 206 includes a corresponding extension member which mates with back connection surface 504 of attachment member 218 to help mount grille 212 thereto.

Figure 6:
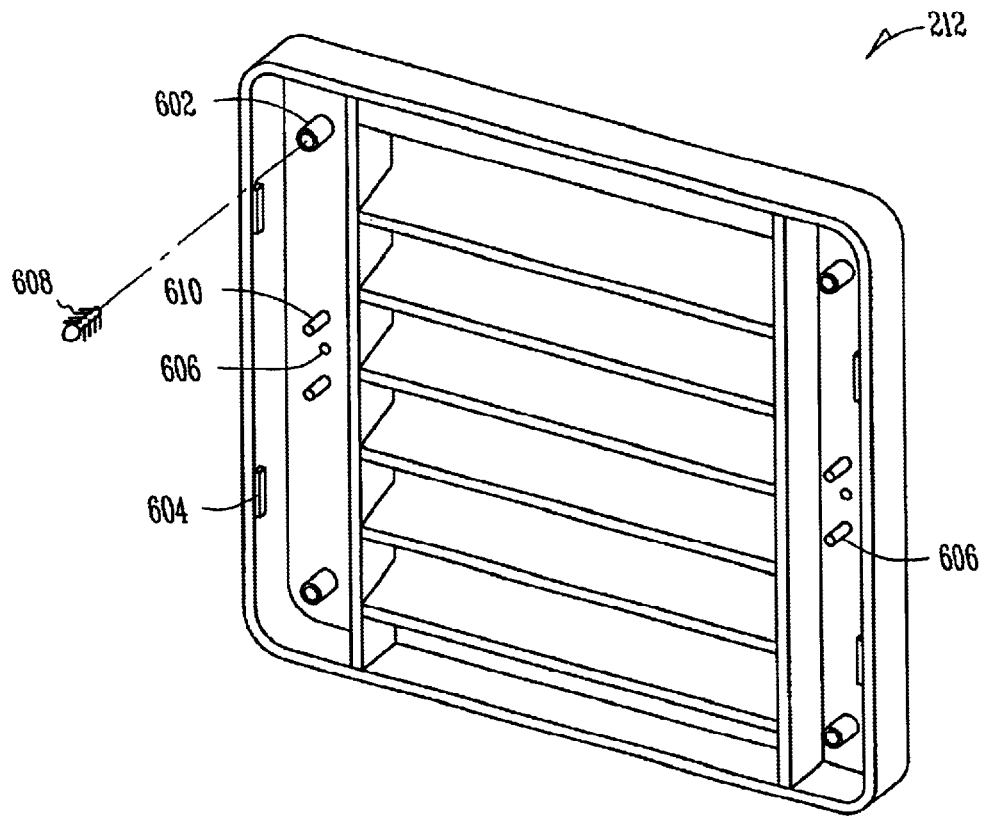
FIG. 6 is a rear isometric view of a grille in accord with one embodiment.

FIG. 6 is a back view showing further details of grille 212 according to one embodiment. Grille 212 includes one or more collar mounting holes 602, one or more plenum mounting members such as extension members 604, and one or more stand-offs such as posts 606.

Collar mounting holes 602 are positioned to correspond with grille mounting holes 320 of stand-off collar 304 (see FIG. 2B). In one embodiment, a post 608, such as a stud or other similar device, is used to couple grille 212 to collar 304. In one example, a first end of post 608 is dimensioned to compress fit within mounting hole 602. Once one or more posts 608 are mounted to grille 212, grille 212 is placed against collar 304 and a second end of post 608 mounts within hole 320 of collar 304. This provides a simple and easily upgradable (or downgradable) structure.

Plenum mounting extensions 604 are positioned to correspond to attachment members 218 of plenum member 206. In one embodiment, extensions 604 include a mounting surface which corresponds to mounting surface 504 of each of attachment members 218. In one example, grille 212 is pressed against plenum member 206 until one or more extensions 604 click into place upon one or more attachment members 218 of plenum member 206. Advantageously, since in one embodiment, grille 212 is plastic and since attachment members 218 are plastic and have a clip structure, it is easy to unclip, remove, and change the grille of fan assembly 104 or exhaust assembly 106 by hand.

In one embodiment, a center punch indentation 610 is located between posts 606. In one option, a designer or user can drill a hole between posts 606 of grille 212 using center punch 610 as a guide. Grille 212 may then be mounted against another surface while posts 606 provide a stand-off so that the grille is not over-tightened upon the mounting surface. For example, using holes drilled between posts 606, a user could mount grille 212 by placing a screw within the hole and attaching the grille to attachment holes 204 of plenum member 206 or attachment holes 322 of stand-off collar 304, or to another corresponding mounting surface.

Figure 7:
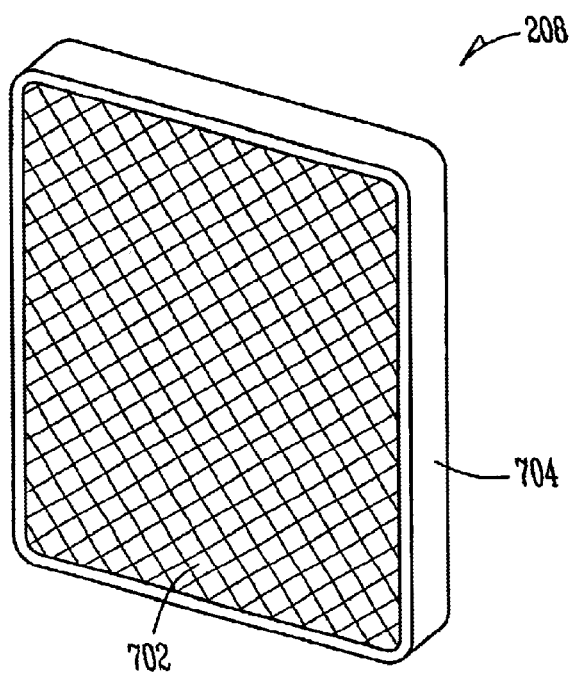
FIG. 7 is an isometric view of a filter according to one embodiment.

FIG. 7 shows an isometric view of filter 208 according to one embodiment. Here, filter 208 includes a first filter member 702 and a second filter member 704 which is placed adjacent the first filter member. In this example, filter member 704 is partially wrapped around the outer surface of filter member 702. In one example, first filter 702 used alone provides a low level of filtration, such as NEMA type 1 filtration. The addition of the second filter 704 helps provide a higher level of filtration, such as NEMA type 12 filtration, for example. In various options, first filter member 702 can be used alone, a different filter can be used, or no filter is used within the system. The modular design of system 100 provides that each of these options is easily attainable. Again, as noted above, different filters can be used in the system depending on the environmental conditions expected, thereby providing different types of enclosures as defined by NEMA, for example.

Figure 8:
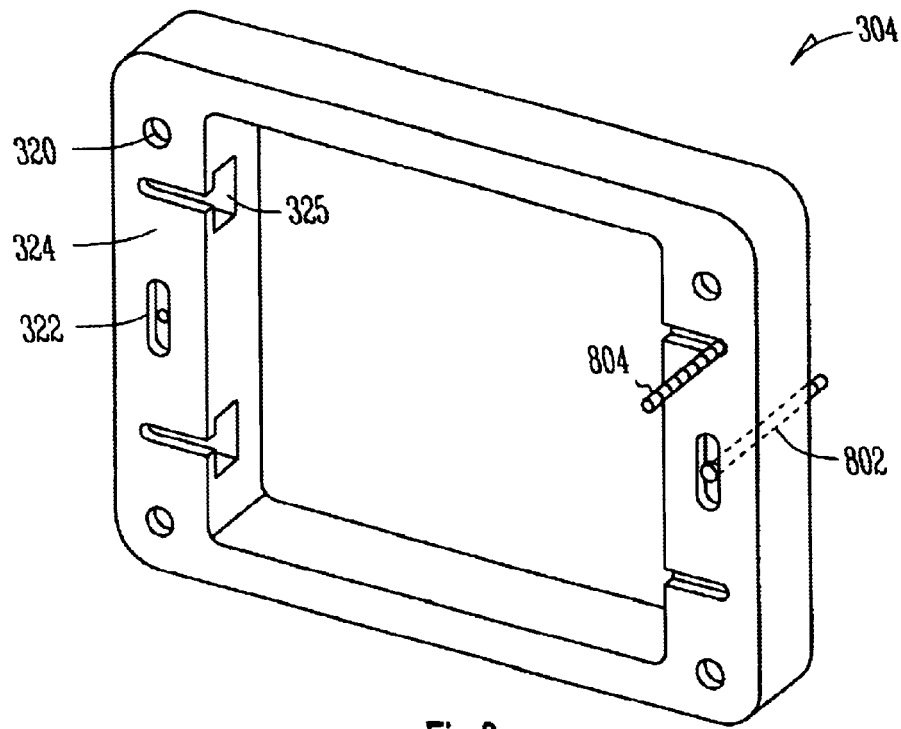
FIG. 8 is a rear isometric view of a stand-off collar according to one embodiment.

FIG. 8 shows a rear isometric view of standoff collar 304 according to one embodiment. Stand-off collar 304 includes first grille mounting holes 320, second grille mounting holes 322, and bolt holding sections 324. Grille mounting holes 320 are positioned and dimensioned to provide mounting with grille 212 using posts or studs 608 (see FIG. 6 and accompanying discussion).

Metal grille mounting holes 322 provide a counter-bore or cut-out space to allow a bolt-head to fit therein. An example of a bolt 802 is shown in FIG. 8. Metal grille 210 is mounted to collar 304 by mating thumb-nuts 230 (See FIG. 2B) to bolts 802. Again, this provides an easily adjustable and modular system. As noted above, in one embodiment a bolt may also be attached to grille 210 and a nut mounted to collar 304 to provide a mating connection.

Bolt holding sections 324 are positioned to correspond to panel mounting holes 250, shielding grille mounting holes 308, and plenum member mounting holes 216 (see FIG. 3). In one embodiment, bolt holding sections include a dovetailed or T-groove 325. This design helps holds a bolt in place. An example of a bolt 804 within section 324 is shown in FIG. 8. This helps provide ease of assembly since a user does not have to try to hold an assembly bolt while trying to assemble all the members of a given fan assembly together.

Figure 9:
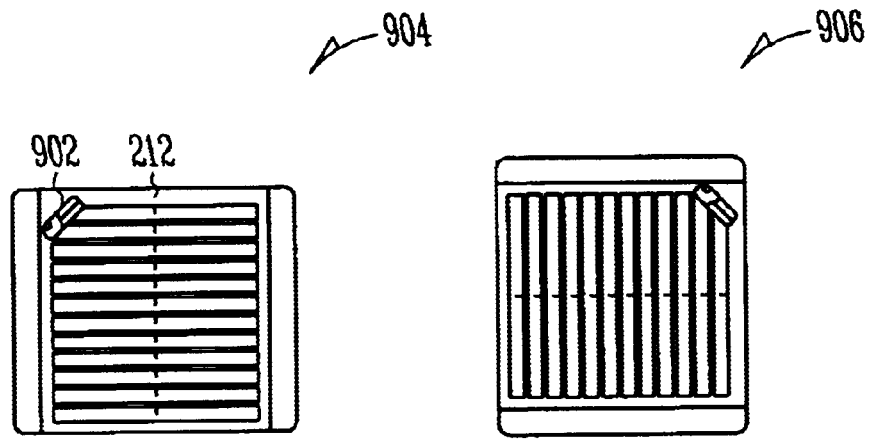
FIG. 9 shows details of a grille according to one embodiment.

FIG. 9 shows two example orientations for grille 212 in accord with one embodiment. In one embodiment, grille 212 includes a label 902. Label 902 may include warning information, direction of airflow information, or a logo or other design. In this embodiment, label 902 is positioned on grille 212 so that it has a generally 45 degree orientation relative to the horizontal and the vertical axes of the grille. This provides that the information on label 902 is readable when the grille is mounted in a first orientation as in example 904 or when it is mounted in a second orientation which is 90 degrees rotated from the first orientation, as in example 906. Among other advantages, this label orientation maintains the legibility of the words or symbols on the label, and it also maintains the aesthetics of the grille. This allows a user to decide whether the fan should be mounted in a landscape or a portrait fashion, without the aesthetics of the grille causing them to be unsatisfied. Moreover, a customer may need to mount modular system 100 on an enclosure panel that is too small for the standard landscape orientation; mounting in a portrait orientation maintains the legibility/or aesthetics of the label.

EXAMPLE OF USE

Figure 10:
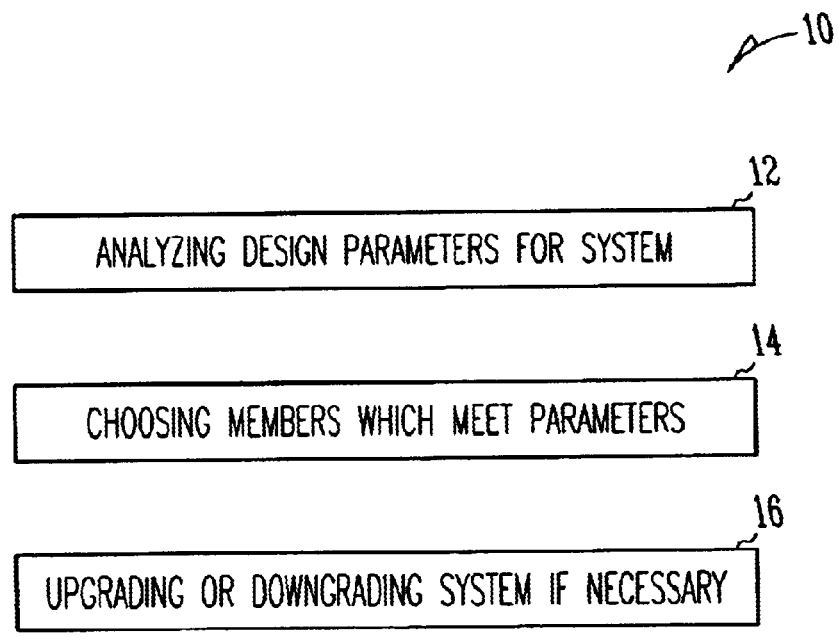
FIG. 10 depicts a method of assembling a fan system according to one embodiment.

FIG. 10 depicts a method 10 for utilizing the present system according to one embodiment. Method 10 includes analyzing design parameters for an enclosure (block 12), choosing members of modular system 100 which meet the design parameters (block 14), and optionally upgrading or downgrading as need arises (block 16).

Analyzing design parameters includes evaluating such factors as location of the enclosure, expected environmental conditions, type of electronics within the enclosure, and other factors which will be apparent to one skilled in the art.

A non-exhaustive example of some possible situations are shown in Table 1. Across the top of Table 1, a user chooses the level of filtration needed. Down the right column, a level of EMI/RFI shielding is chosen. By reading down and across a given option for an exemplary fan system is selected.

TABLE 1

| Radiation shielding/<br>Filtration type | NEMA Type 1<br>filtration | NEMA Type 12<br>filtration |
|---|---|---|
| EMI/RFI shielding | Option 1 | Option 2 |
| No EMI/RFI shielding | Option 3 | Option 4 |

Choosing members of modular system 100 which meet the design parameters includes selecting and assembling the various members described above in FIGS. 1–9 that are appropriate for a user's situation. Upgrading (or downgrading) the system is simply a matter of choosing the necessary components needed and incorporating them into the system. Advantageously, the various members of system 100 include features which allow them to be assembled in various manners depending on the user's need.

For example, if a user chose option 1 from Table 1, then they could assemble a fan assembly 104 which included a fan 204, a plenum member 206 or 350, an EMI/RFI shielding grille 302, a stand-off collar 304, a NEMA type 1 rated filter 208, and either metal grille 210 or plastic grille 212. An exemplary option 1 exhaust fan 106 assembly would include an EMI/RFI shielding grille 302, a stand-off collar 304, a NEMA type 1 rated filter 208 and either metal grille 210 or plastic grille 212. In one option, a user could omit EMI/RFI shielding grille 302 and use an enclosure 102' as in FIG. 2C which includes EMI/RFI perforations 360.

If option 2 was chosen (or if a user needed to upgrade to option 2), then in addition to the above components a sealing gasket 202 and a filter 208 would be added which would provide NEMA type 12 filtration for the enclosure. Referring to FIG. 7, it can be seen that simply by adding second filter member 704 around first filter member 702, a NEMA type 1 filter is transformed into a NEMA type 12 filter.

If option 3 is originally chosen (or if a user needed to upgrade to option 3) a user would assemble a fan assembly 104 which included a fan 204, a plenum member 206 or 350, a NEMA type 1 filter 208, and either metal grille 210 or plastic grille 212. An exemplary option 3 exhaust fan 106 assembly would include a NEMA type 1 filter 208 and either metal grille 210 or plastic grille 212.

If option 4 was chosen (or if a user needed to upgrade to option 4), then in addition to the above components of option 3, a sealing gasket 202 and a filter 208 would be added which would provide an enclosure having NEMA type 12 filtration. Again, referring to FIG. 7, it can be seen that simply by adding second filter member 704 around first filter member 702, a NEMA type 1 filter is transformed into a NEMA type 12 filter.

As noted above, the above options are meant to be examples and not an exhaustive list of possible permutations of the components of modular fan system 100.

CONCLUSION

Sometimes enclosures for holding electronics must be tightly sealed, other times they must block EMI/RFI radiation. Typically, each user of a system has different opinions on the aesthetics of the design. Sometimes, an electronic system is upgraded, and the enclosure is then unusable since it is designed for the original system. Thus, what is needed is a system that permits a customer to change the filtration and/or radiation and/or aesthetic features of a mass produced enclosure without the expense of a custom designed enclosure. Accordingly, a modular fan system has been devised that provides a user with upgradable flexibility and allows an original system to have a wide variety of set-ups depending on the user's requirements. In one aspect, a modular fan system includes a fan, a plenum member adapted to be mounted to the fan and adapted to be mounted to an enclosure, a gasket adapted to be mounted between the plenum member and the enclosure, a filter adapted to be mounted within the plenum member; and a grille adapted to be mounted to the plenum member. In the system, the fan, the plenum member, and one or more of the gasket, the filter, and the grille are assemblable into a first fan assembly which provides for an enclosure having a first level of filtration and are alternatively assemblable into a second fan assembly which provides a second, higher level of filtration.

One aspect provides a modular fan system which includes a fan, a plenum member adapted to be mounted to the fan and adapted to be mounted to an enclosure, a stand-off collar adapted to be mounted to the enclosure, a first grille adapted to be mounted to the plenum member and adapted to be alternatively mounted to the stand-off collar, and an EMI/RFI shielding grille adapted to be mounted to the plenum member. In the system, one or more of the fan, the plenum member, the stand-off collar, the first grille, and the shielding grille are assemblable into both a non-EMI/RFI-shielding fan assembly and are alternatively assemblable into a EMI/RFI-shielding fan assembly.

The present invention provides a low-cost cooling solution giving a buyer/user the options of various levels of filtration, field installable upgrades for EMI/RFI protection, and/or optional grille aesthetics. This allows a customer to change the cooling and/or radiation features of a mass produced enclosure without the expense of a custom designed enclosure.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A plenum member for an enclosure, the plenum member comprising:
a plenum body having a back surface for mounting to a fan and a front surface, there being an area between the back surface and the front surface for holding a filter, the plenum body including mounting holes for mounting the plenum to an enclosure, the plenum body including first attachment members adapted for snap-on mounting a first grille over the front surface of the plenum body, the plenum body further including second attachment members for screw-on mounting a second grille over the front surface of the plenum body in place of the first grille.

2. The plenum member of claim 1, wherein the first attachment members include one or more clips located around a periphery of the plenum body adapted to engage corresponding extension members located on the first grill.

3. The plenum member of claim 2, wherein the one or more clips include a hook shaped structure having one side attached to the plenum body and three sides not attached to the plenum body and including a back surface to engage the corresponding extension members on the first grille.

4. The plenum member of claim 1, wherein the plenum member includes a flange around a periphery of the plenum member and the mounting holes, the first attachment members, and the second attachment members are located on the flange.

5. The plenum member of claim 1, wherein the second attachment members include mounting holes positioned on the plenum member to correspond to one or more nuts or bolts mounted on the second grille.

6. The plenum member of claim 1, wherein the first attachment members include one or more clips located around a periphery of the plenum body and having an inner mounting surface adapted to frictionally engage an EMI/RFI shielding grille mounted thereto.

7. A grille for an enclosure, the grille comprising:

a plastic grille body having a plurality of perforations, the grille body including one or more extension members proximate an outer portion of the grille body for snap-fitting the grille to a plenum member, the grille further including one or more indentations which are positioned on the plastic grille body so as to be usable as a guide for forming one or more holes through the one or more indentations to allow a mounting member to be inserted through the one or more holes for mounting the grille body by the mounting member to the plenum member in an alternative assembly.

8. A grille for an enclosure, the grille comprising:

a plastic grille body having a plurality of perforations, the grille body including one or more extension members proximate an outer portion of the grille body for snap-fitting the grille to a plenum member, the grille further including one or more indentations which are positioned on the plastic grille body so as to be usable as a guide for forming one or more holes through the one or more indentations to allow a mounting member to be inserted through the one or more holes for mounting the grille body by the mounting member to the plenum member in an alternative assembly, wherein the grille body further includes at least one standoff post proximate each of the one or more indentations to prevent over-tightening of the plastic grille to the plenum member.

9. The grille of claim 8, wherein the grille body includes a label on a front surface of the grille, wherein the label is oriented at an angle so that the label is readable when the grille is in a first orientation or rotated 90 degrees to a second orientation.

10. The grille of claim 9, wherein the angle is approximately a 45 degree angle relative to a horizontal axis of the grille.

11. A grille for an enclosure, the grille comprising:

a plastic grille body having a plurality of perforations, the grille body including one or more extension members proximate an outer portion of the grille body for snap-fitting the grille to a plenum member, the grille further including one or more indentations which are positioned on the plastic grille body so as to be usable as a guide for forming one or more holes through the one or more indentations to allow a mounting member to be inserted through the one or more holes for mounting the grille body by the mounting member to the plenum member in an alternative assembly, wherein the grille body further includes one or more mounting holes adapted to removably hold a post, wherein the post can be used to mount the grille body to a stand-off collar having one or more holes corresponding to the one or more mounting holes of the grille body.

* * * * *